United States Patent [19]

Hassun et al.

[11] 4,454,486

[45] Jun. 12, 1984

[54] WAVEFORM SYNTHESIS USING MULTIPLEXED PARALLEL SYNTHESIZERS

[75] Inventors: Roland Hassun, San Carlos; Albert W. Kovalick, Santa Clara, both of Calif.

[73] Assignee: Hewlett-Packard Company, Palo Alto, Calif.

[21] Appl. No.: 317,220

[22] Filed: Nov. 2, 1981

[51] Int. Cl.³ .................... H03C 3/00; H03K 3/80; H03K 7/06; H03K 13/11

[52] U.S. Cl. ................... 332/16 R; 328/14; 364/721; 375/44; 455/133

[58] Field of Search ............ 332/16 R, 19; 324/79 D, 324/83 D; 328/14, 27, 155; 364/720, 721; 455/110, 113; 375/44–49, 52–56

[56] References Cited

U.S. PATENT DOCUMENTS 4,134,072  1/1979  Bolger ................... 328/14

*Primary Examiner*—Siegfried H. Grimm
*Assistant Examiner*—W. R. Paxman
*Attorney, Agent, or Firm*—Edward Y. Wong

[57] ABSTRACT

A novel signal synthesizer provides high frequency synthesized waveforms for the user. By converting phase information into digital outputs in parallel and by selectively coupling these digital outputs, an ordered digital output is formed to provide the high frequency waveforms. This ordered digital output, which represents points on a sine function, is converted to an analog signal for the synthesizer output. Furthermore, frequency and phase modulations of the synthesized waveforms are easily implemented with this novel signal synthesizer; the modulation information is simply added to the digital outputs prior to selectively coupling. Thus when the ordered digital output is converted to an analog signal, the analog signal contains the modulation information.

17 Claims, 11 Drawing Figures

WAVEFORM SYNTHESIS USING MULTIPLEXED PARALLEL SYNTHESIZERS

BACKGROUND OF THE INVENTION

In the art of synthesizing signals, three distinguishable techniques have been used: direct synthesis, indirect synthesis, and numerical synthesis.

In the technique of direct synthesis, the desired signal is produced directly from an oscillator. This technique, however, is limited in frequency. And in synthesizing a wide frequency range, this technique becomes extremely complex and costly. Hence this technique is not widely used for either high frequencies or wide frequency ranges.

In indirect synthesis, phase lock loops with programmable frequency dividers are commonly used to synthesize the desired frequencies. This technique is by far the most widely used at present both in commercial products and in dedicated applications. The method owes its popularity in large part to the advent of inexpensive programmable frequency dividers in integrated circuit form. The result has been a substantial reduction in complexity, especially in comparison with direct synthesis.

However, neither the direct synthesis nor the indirect synthesis technique in the prior art allows for phase-continuous switching of the carrier signal when the desired synthesizer signal is modulated. Furthermore, both techniques require extensive analog components which are subject to drift and malfunction through aging, temperature effects, and the like.

Numerical synthesis with digital techniques is useful for avoiding the above problems. Basically, numerical synthesis consists of generating a stream of points representing a desired signal by using digital logic circuits. Then this numerical data stream is converted into the actual desired signal by means of a digital-to-analog converter (DAC). An example of such a system for synthesizing signals in the prior art is described in U.S. Pat. No. 3,928,813. FIG. 1 shows a block diagram of a typical digital numerical synthesizer known in the art. Therein, the defining relationship for frequency is $F=(\Delta\phi/\Delta T)/(2\pi)$. If $\Delta T$ is the period of the digital clock, then $\Delta\phi$ uniquely defines the frequency.

Although prior art synthesizers using the numerical synthesis technique result in less complicated synthesizers than those using the direct and indirect synthesizer techniques, these prior art numerical synthesizers nevertheless have a definite drawback: they characteristically have a low output frequency. The numerical synthesizer in accordance with the present invention overcomes this drawback and simultaneously preserves the other advantages of the numerical synthesis technique.

In order to gain a better understanding of the advantages of the preferred embodiment in accordance with the invention, a brief discussion of numerical synthesizers in the prior art follows.

Essential to any numerical synthesizers is a phase accumulator, as shown in FIG. 1. Its function is to generate a linearly increasing digital signal whose value represents phase in radians. The defining relation between frequency and phase is $$F=(\Delta\phi/\Delta T)/(2\pi),$$

where $\Delta\phi$ is a selected value representing a phase increment and $\Delta T$ is the period of the system clock for determining an output frequency. The number of different frequencies available in this synthesizer is then $2^M$, where M is the number of bits in the field for $\Delta\phi$. If M equals 24 and the clock frequency $F_c=1/T$ is 33.55 MHz, then the frequency resolution is $(33.55\times 10^6)/(2^{24})=2$ Hz. As illustrated in FIG. 1, phase accumulation occurs by repeatedly adding at every clock cycle of 1/T the last phase output to $\Delta\phi$. The phase output, then, at clock cycle N is $$\phi out=N\Delta\phi.$$

Eventually the adder 10 in the accumulator will overflow, since it is a modulo device with a modulo of $2^M$. This overflow does not cause a loss of useful phase, however. Since $2^M$ represents $2\pi$ radians, any phase overflow represents the phase of the next cycle of output. This is illustrated in FIG. 2. The simplicity of the accumulator is obvious. Its disadvantage, however, is in speed. With a 33.55 MHz clock, a new phase is available every 30 nanoseconds. Hence, all M bits must be added and latched within this time. This adding time, then, acts as a speed limitation to the numerical synthesizer. In other words, this places an upper limit on the maximum useful output frequency available.

Once the phase is available, the next step is to convert it to a sinusoidal wave, that is, a wave whose amplitude varies with time. The amplitude is still maintained in digital form. According to the Nyquist or uniform sampling theory, two points on the sine wave are sufficient to perfectly describe it. If the sample points are not exactly correct in phase and amplitude, then harmonics and spurious signals result. The ideal phase-to-amplitude converter (PAC) is a sine lookup table, such as a read-only-memory device (ROM) with $2^M$ words, having each word or sine amplitude value infinitely accurate. In reality, however, only something less than the ideal is available.

If the constraint of infinite amplitude accuracy is reduced to an accuracy of K bits per word, then the ROM size would be $K2^M$ bits. For example, with $M=24$ and $K=12$, the ROM would have 16.7 million words of 12 bits each. Choosing $K=12$ would give an amplitude resolution of 0.024 percent. This ROM is far too large to be practical, and some bits must be ignored. If some significant bits, say L bits, are tapped off the phase accumulator output, then the phase input to the PAC is truncated. This truncation then results in spurious signals in the system. However, if $L=13$, then the spurious signals are less than $-70$ dB. Thus, a practical approach is to use a ROM with 12 bits per word and 8K words.

The size of the ROM lookup table can be reduced even more by partitioning each output cycle into quadrants. Only 0°–90° must now be stored in the ROM. The other quadrants are easily generated from the quadrant number and 0°–90° sine information. This allows the ROM to be 12×2K (25K bits) in size. Although this is a reasonable size, it must have a read access time of at least 30 nanoseconds. This access time is very small for this size of ROM.

A useful frequency output for a signal synthesizer is 215 MHz. Since a sampling rate of 2.5 samples per output cycle rather than a mere 2 samples per output cycle would be desirable to compensate for losses, e.g., filter loss, the clock rate corresponding to this sampling rate of 215 MHz would be 215×2.5 MHz, or 537 MHz. Constructing a digital system with a sine lookup table having an output of 215 MHz and a clock frequency of 537 MHz is extremely difficult with the prior art. The technique in accordance with the invention, however, allows both a 215 MHz output and a computing rate, or effective clock rate, of 33.55 MHz. This slower rate is much more tractable than a clock rate of 537 MHz. In other words, the novel technique allows high frequency synthesis with the straight-forwardness and advantages of low frequency synthesis.

SUMMARY OF THE INVENTION

The present invention relaxes the demand on generating time for each point on the synthesized output waveform. This is accomplished by having several sine generators working in parallel and by selecting the outputs of these sine generators in a predetermined sequence to produce a new signal representing the waveform being synthesized. The sine generator is a digital block that includes a phase accumulator coupled to a phase-to-sine amplitude converter, that is, a sine lookup table. FIG. 3 shows a diagram of such a digital block. Its output is in the digital domain. The digital output of each sine generator is then synchronously selected and coupled to a digital-to-analog converter (DAC), where the signal being synthesized is converted from the digital domain to the analog domain.

A simplified four-channel architecture of the invention, that is, a synthesizer having four sine generators in parallel, can be used to illustrate the principle of parallel synthesis in accordance with the invention. FIG. 4A shows the illustrative embodiment. A phase increment of $\Delta\phi$ is shifted 2 bits to obtain $4\Delta\phi$. This shifted increment of $4\Delta\phi$ is the phase increment input to all four parallel generator blocks. In effect, each sine generator is looking ahead four phase points on the waveform being synthesized and is generating that sine value. To achieve this look ahead advantage, the sine generator outputs are offset in phase by a predetermined amount, producing outputs of $\sin(4\Sigma\Delta\phi+\text{phase offset})$. They then are sampled by a multiplexer in a selected sequence and the sequence is applied to a DAC. The sequence produced by the multiplexer can be for example, sin(X), where X is the following sequence:

0, $\Delta\phi$, $2\Delta\phi$, $3\Delta\phi$, $\Delta\phi(4)$, $\Delta\phi(4+1)$, $\Delta\phi(4+2)$,
$\Delta\phi(4+3)$, $\Delta\phi(8)$, $\Delta\phi(8+1)$, $\Delta\phi(8+2)$, $\Delta\phi(8+3)$,
$\Delta\phi(12)$, etc.

The digital-to-analog input port then actually sees the digital values for a synthesized sine value generated in steps of $\Delta\phi$, even though each sine generator is operating in steps of $4\Delta\phi$. This result is graphically illustrated in FIG. 4B. The phase offset contained in the output of each sine generator and the selected sequence obtained with the multiplexer insure this result.

A synthesizer in accordance with the present invention realizes many advantages. Foremost among them are the following:

1. Since each sine generator block operates at a fraction of the clock rate, for example, one-quarter of the clock rate, or $F_c/4$ as in the illustrated embodiment, each sine generator, or channel, has quadrupled the time to generate a synthesized output in comparison with prior art single channel generators for the same synthesized frequency. This places less demand on the synthesizing circuits in the system.

2. The maximum usable output frequency that can be synthesized is not more than half the clock rate, or $F_c/2.5$, if allowance is made for filtering losses. However, by having a parallel structure in accordance with the invention, very high output frequencies can be achieved with reasonable sine generation time. By using a pipeline architecture and very fast sine lookup ROM's, it is feasible to have a channel clock period of 15 nanoseconds.

BREIF DESCRIPTION OF THE DRAWINGS

DETAILED DESCRIPTION OF THE PREFERRED EMBODIMENT

Figure 1:
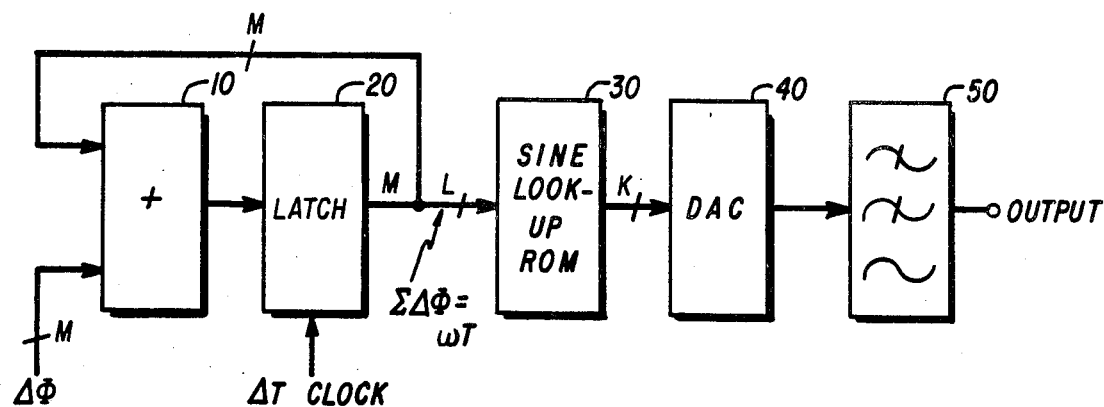
FIG. 1 is a block diagram of a prior art synthesizer.
Figure 2:
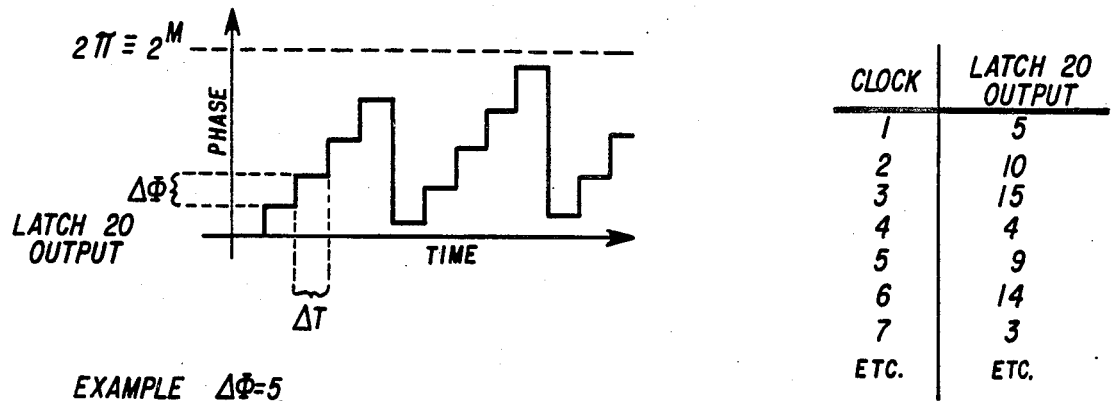
FIG. 2 is the typical phase output of the latch circuit in FIG. 1.
Figure 3:
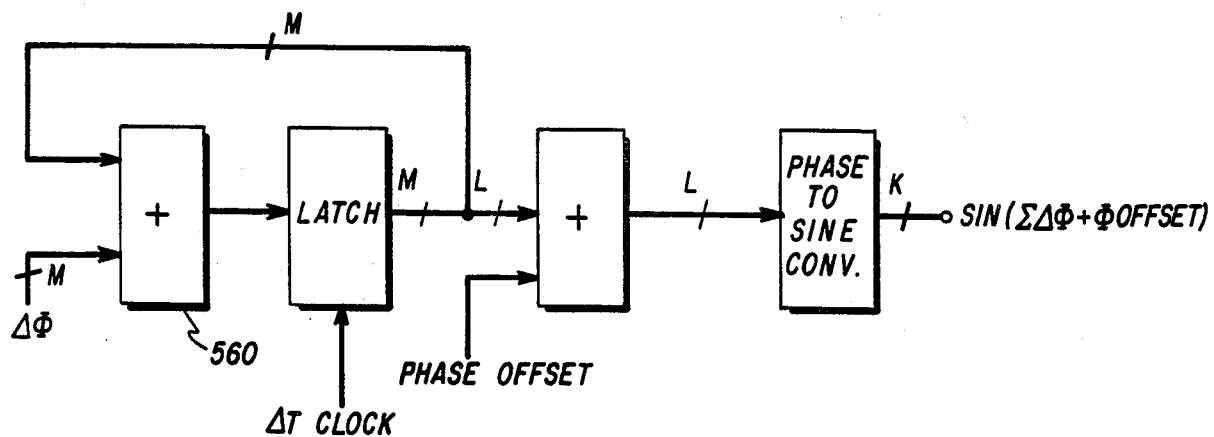
FIG. 3 is a sine generator block in accordance with the invention.
Figure 3:
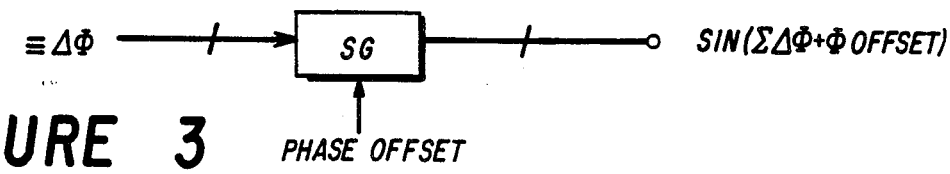
Figure 4A:
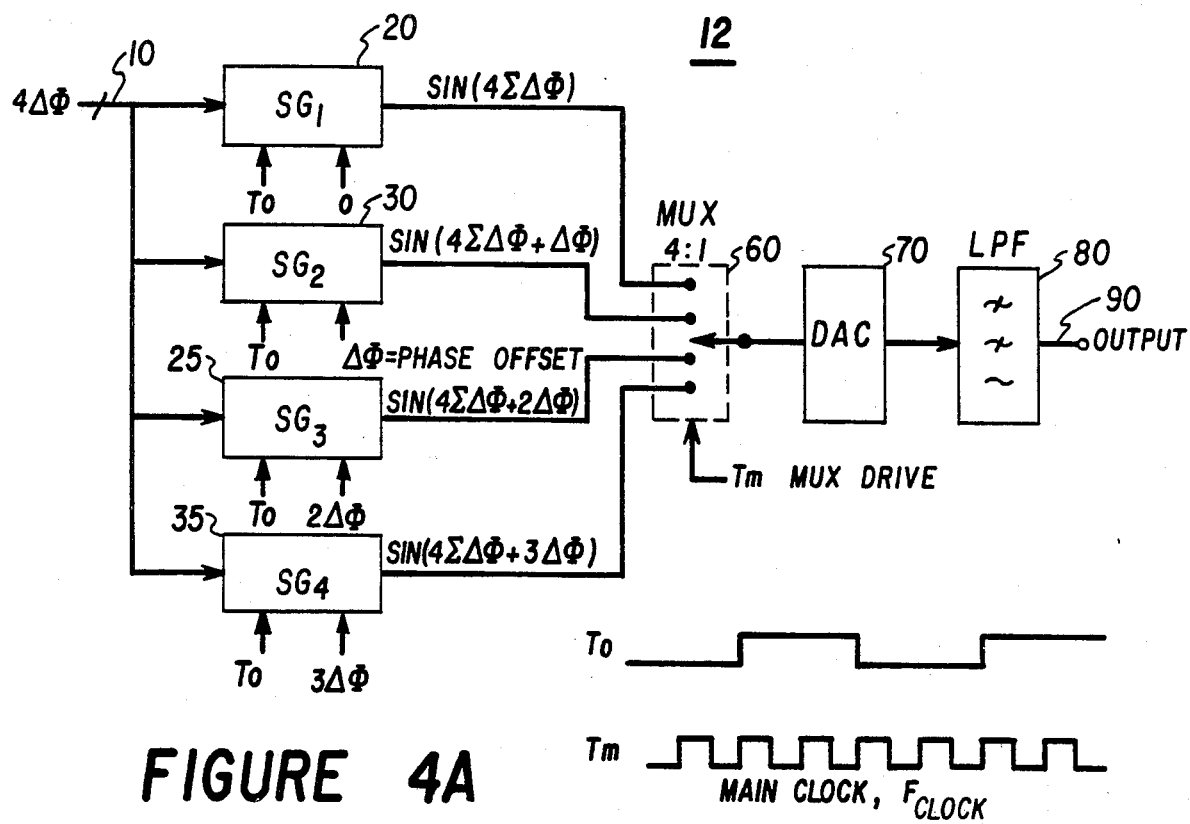
FIG. 4A is a block diagram of a four-phase parallel synthesizer in accordance with the invention.
Figures 5, 6C:
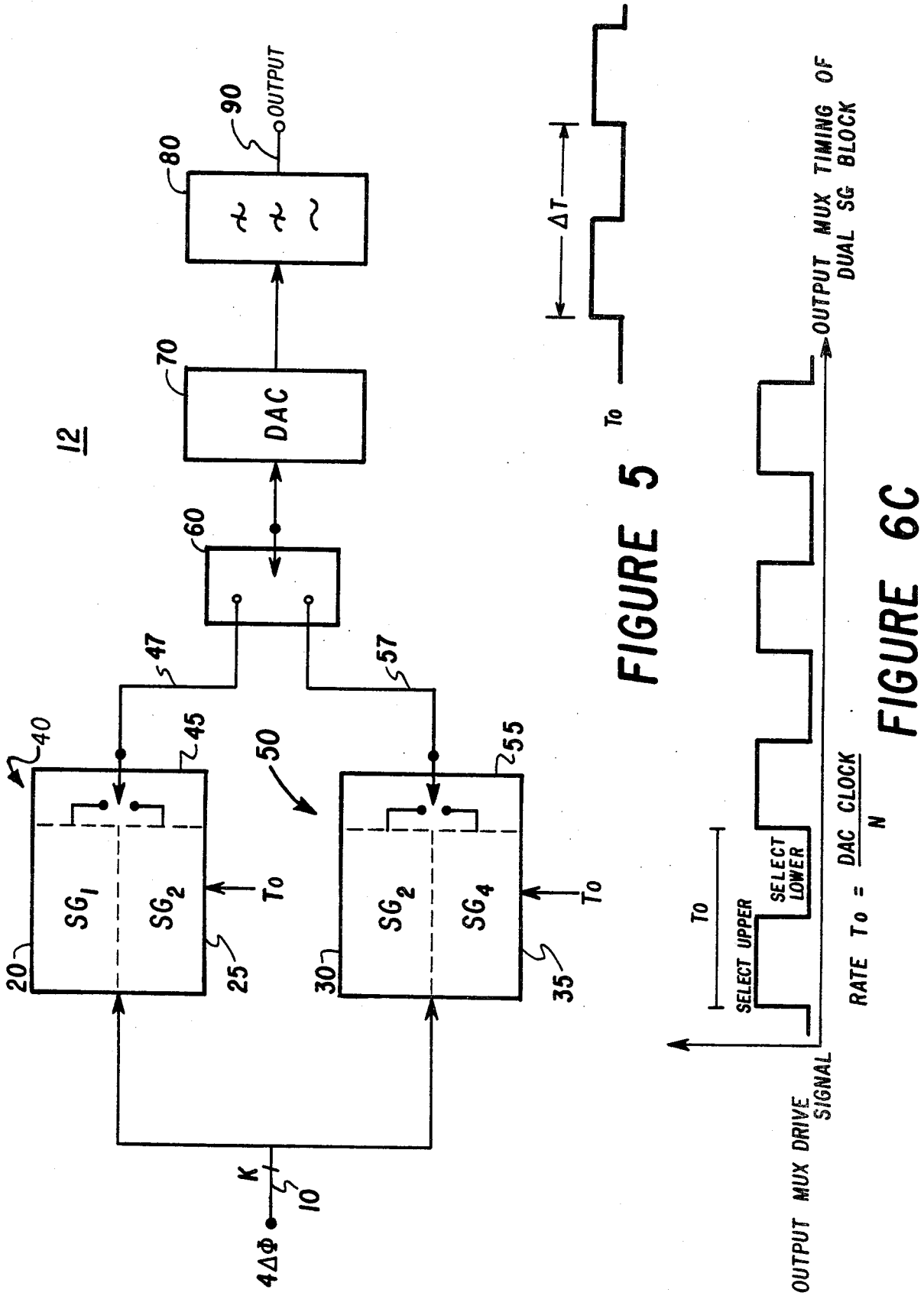
FIG. 5 is a block diagram of a four-phase parallel synthesizer in accordance with the preferred embodiment of the invention.
FIG. 6C shows the output multiplier timing of the dual sine generator generator block of FIG. 6B.

FIG. 4A shows a block diagram of a preferred embodiment in accordance with the invention. As an illustration, a synthesizer 12 having four parallel sine generators 20, 25, 30, 35 is shown; the number of parallel sine generators can, of course, be varied in other embodiments still in accordance with the invention. An input of K bit data, $4\Delta\phi$, is supplied to the input port 10 of the synthesizer 12. This corresponds to an output frequency, F, defined by the relationship $F=(\Delta\phi/\Delta T)/(2\pi)$. The four parallel sine generators 20, 25, 30, 35 can be grouped two together for more efficient circuit operation. This is shown in FIG. 5. In this preferred embodiment, the four channels formed by the four sine generators 20, 25, 30, 35 are partitioned such that each pair of sine generators 20, 25 and 30, 35 or constructed on a single integral circuit 40, 50. Further, each of the integral circuits 40, 50 has a 2:1 multiplexer 45, 55. The multiplexer 45, 55 switches between the two sine generators 20, 25 and 30, 35 and provides a single output data stream on an output bus 47, 57 from each of the integral circuits 40, 50. This configuration of FIG. 5 reduces intercircuit wiring and simplifies the hardware for each phase in comparison with the embodiment in FIG. 4A. The data output buses 47, 57 are selectively coupled to a DAC 70 by a system multiplexer 60 present in both embodiments. In both FIGS. 4A and 5, by judiciously selecting the sequence, the input to the DAC 70 can be made to be a sequence of words representing a waveform of a desired frequency to be synthesized. Table 1 lists a DAC input sequence. In this instance, the DAC 70 input is a digital valued sine wave that is sampled in steps of $\Delta\phi$. The resultant analog signal, which represents the waveform being synthesized, is next filtered through a low pass filter (LPF) 80 before it is coupled to the output port 90 of the synthesizer 12.

Figure 6A:
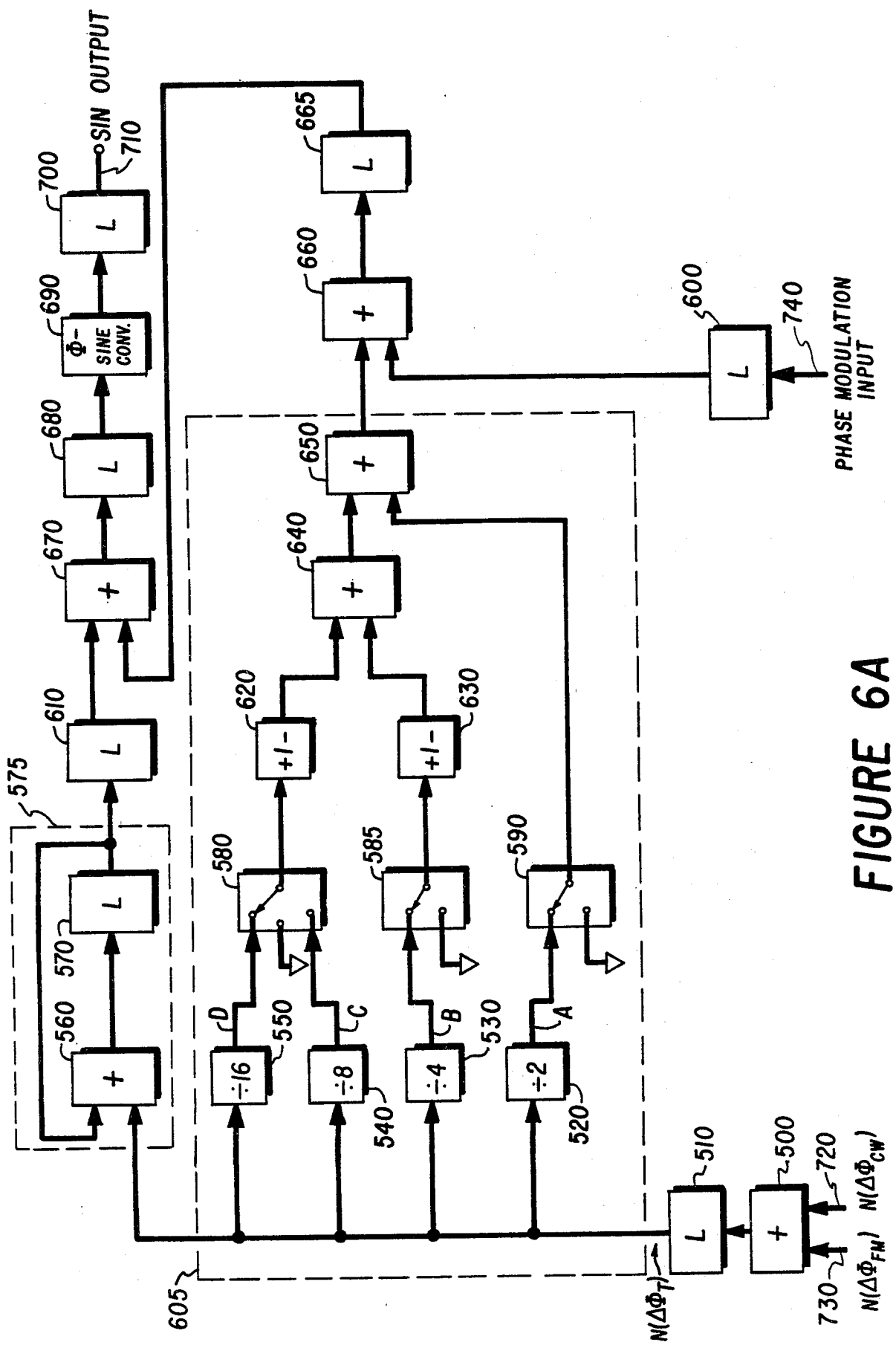
FIG. 6A is a block logic diagram of a preferred embodiment of a sine generation block.

FIG. 6A illustrates in greater detail one of the parallel sine generator blocks 20, 25, 30, 35 depicted in FIG. 5. The illustrated sine generator block has a phase offset generator section 605 to provide the necessary phase offset signals to the sine generator. Central to the sine generator are an adder 560 and a latch circuit 570. The output of the latch circuit 570 is fed back to the adder 560 so that the applied phase increment signal is accumulated with each clock cycle. The accumulated output is coupled to another latch circuit 610, the accumulator latch circuit, before it is phase-shifted. Phase shift is accomplished by adding with an auxiliary adder 670 to the accumulated phase output a phase offset signal from the phase offset generator 605. The phase shifted accumulated signal is then coupled to a phase-to-sine converter 690 via an auxiliary latch circuit 680. After the conversion, the signal is held at a converter latch circuit 700 for use in the system.

The phase offset generator 605 has a series of dividers 520, 530, 540, 550 to accommodate the sine generator block of a 16-channel synthesizer. Each of these dividers 520, 530, 540, 550 has the same input $N\Delta\phi$. The output from each can be referenced as A, B, C, and D, respectively. Depending on the number of channels the sine generator block is to make, the outputs are combined in accordance with Tables 3–5. These combinations are accomplished with multiplexers 580, 585, 590 followed by polarity circuits 620, 630 and adders 640, 650, 660. Whenever the appropriate combination is obtained for the desired phase offset, the phase offset is then coupled to the sine generator adder 670 as a phase offset signal for shifting the generated sine value.

The sine generator block illustrated in FIG. 6A also shows provisions for phase and frequency modulations. A frequency modulation (FM) adder 500 combines the carrier, or center, frequency $N(\Delta\phi_{cw})$ at an input line 720 with the modulating input $N(\Delta\phi_{fm})$ at another input line 730. Together, the combination $N\Delta\phi = N(\Delta\phi_{fm} \pm \Delta\phi_{cw})$ is applied to the phase accumulator 575 and divider 520, 530, 540, 550 inputs. That the resulting signal is frequency modulated can be seen as follows. The synthesized frequency is $F = (\Delta\phi/\Delta T)/(2\pi)$; it follows that since $\Delta\phi = \Delta\phi_{fm} \pm \Delta\phi_{cw}$, F becomes $F = [(\Delta\phi_{fm} \pm \Delta\phi_{cw})/\Delta T]/(2\pi)$. This is FM.

Phase modulation (PM) is accomplished through an input line 740 to a PM latch circuit 600 fed to phase offset generator adder 660. From there, the modulation information is coupled along with the phase offset information to the auxiliary adder 670 and combined with the accumulated phase signal. Thus, when the phase signal is converted to a sine signal via the coverter 690, the sine signal will contain modulation information, whether it be frequency or phase modulation. In the case of PM, the sine output is $\sin N(\Sigma\Delta\phi + \phi_m)$, where $\phi_m$ is the phase modulation. And in the case of FM, the sine output is $\sin(\Sigma\Delta\phi + \Delta F\Sigma\Delta\phi_{fm})$, where $\Delta F$ is the frequency deviation, or modulation index.

In the illustrated embodiment of the invention shown in FIG. 6A, the user enters a value $N(\Delta\phi)$ into a center frequency input port 720. N is the number by which $\Delta\phi$ is multiplied before it enters the sine generator block. In an 8-channel parallel system, N is 8; so in this instance a user always enters $8\Delta\phi$. Frequency modulation data, if any, are added to the center frequency data in the FM adder 500. The output of the FM adder 500, therefore, is the total instantaneous phase $N\Delta\phi_T$.

The output of an FM latch 510 is the input to the phase accumulator 575 and the input to the phase offset generator 605. The phase offset needed for a particular sine generator depends on the number of channels present in the system and the designation of the particular sine generator block in the system. For example, if the sine generator block is defined as the third channel in a 4-channel system, the phase offset that is needed is $2\Delta\phi$. This is tabulated in Table 3. This value is achieved by selecting field A using a 2:1 multiplexer 590. For a particular channel system, the A, B, C, D fields have different weights. This is shown in Table 6. In like manner, all the phase offsets needed for any configuration having 1, 2, 4, 8, or 16 channels are obtained by combining the A, B, C, D fields in different combinations using multiplexers 580, 585, polarity circuits 620, 630, and a first offset adder 640. The output of the phase offset generator 605 is added with any phase modulation that is on the phase modulation input port 740.

The phase accumulator output ($N\Sigma\Delta\phi_T$) is added to the output of the phase modulation adder 660 to form the output of the auxiliary adder 670. The output of the auxiliary adder 670 is the total phase, that is, $N\Sigma\Delta\phi_T$ plus the phase offset and the phase modulation. This total phase is converted by a phase-to-sine converter (PAC) 690. This PAC 690 may be a ROM lookup table or equivalent. A converter latch 700 is coupled to the output of the PAC 690. Finally the output of the PAC latch 700 is coupled out as the desired channel output.

The sine generator block depicted in FIG. 6A may be thought of as a universal element in an N-channel numerical synthesizer. As shown in an earlier paragraph, a sine generator block in accordance with the present invention can be programmed to perform the functions of any desired channel. Since the phase offset value is the only difference between otherwise identical channels, only the phase offset generator need be programmed for channel position.

Figure 6B:
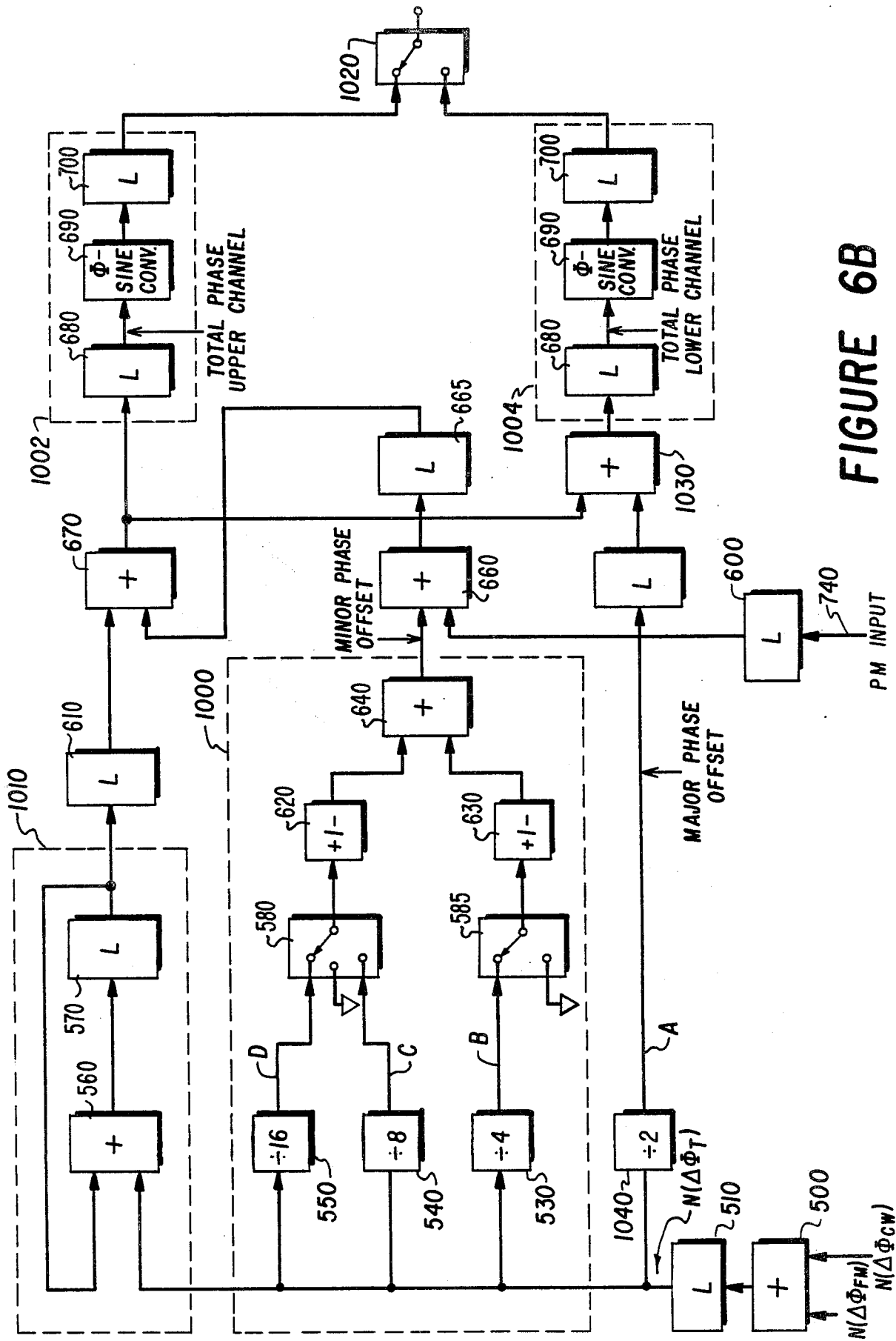
FIG. 6B illustrates a dual sine generator block.

It is possible to improve the sine generator block in FIG. 6A by combining two sine generator blocks 1002, 1004 into one dual sine generator block. This saves hardware and can be efficiently implemented in very large scale integration. FIG. 6B shows such an improved dual channel sine generator.

An advantage of the channel sine generator block depicted in FIG. 6B over that of FIG. 6A is that two channels 1002, 1004 share a common phase accumulator 1010 and a common minor phase offset generator 1000. Further, an output multiplexer 1020 combines the outputs of the two channels 1002, 1004 to provide a single higher frequency output. This output multiplexer 1020 performs the same function as the internal multiplexers 45, 55 in the system in FIG. 5.

The two-channel sine generator block is comprised of an upper channel 1002 and a lower channel 1004. The output multiplexer 1020 selects between these two channels 1002, 1004. The multiplexer 1020 selects the appropriate channel according to the graph shown in FIG. 6C. The upper channel 1002 can be described as $\sin(N\Sigma\Delta\phi_T + \phi_{minor\ offset})$. The lower channel 1004 can be described as $\sin(N\Sigma\Delta\phi_T + \phi_{minor\ offset} + \phi_{major\ offset})$. The major offset is generated by a divider 1040; this value for the major offset is the same for any channel. It is always $N\Delta\phi_T/2$. Separating the upper and lower channels 1002, 1004 by this value allows the sharing of the same minor offset generator 1000 between both channels 1002, 1004. For example, in a 16-channel system, channels 1 and 9 both have the same minor offset, namely $-5\Delta\phi_T$. But the channel identified as 9 has the additional major offset $8\Delta\phi_T$. Channels 3 and 11, likewise, have the same minor offset, namely $-3\Delta\phi_T$. But the channel identified as 11 has the additional major offset $8\Delta\phi_T$. Tables 2 and 5 show that channels 1–8 are offset in phase by the minor offset generator output only when channels 9–16 are offset by the same minor offset plus the major offset. This major offset is identified as the A field in Tables 3, 4, 5 and 6.

Another advantage of separating the upper channel 1002 and lower channel 1004 by $N\Delta\phi_T/2$ is that the output multiplexer 1020 has sufficient time to switch between channels. FIG. 6C shows that the output multiplexer 1020 switches at a rate that is twice the channel computation rate, or clock rate. In order for this timing to work, the upper and lower channels 1002, 1004 must be separated by N/2 channel positions. The major phase offset accomplishes this function.

Figure 6D:
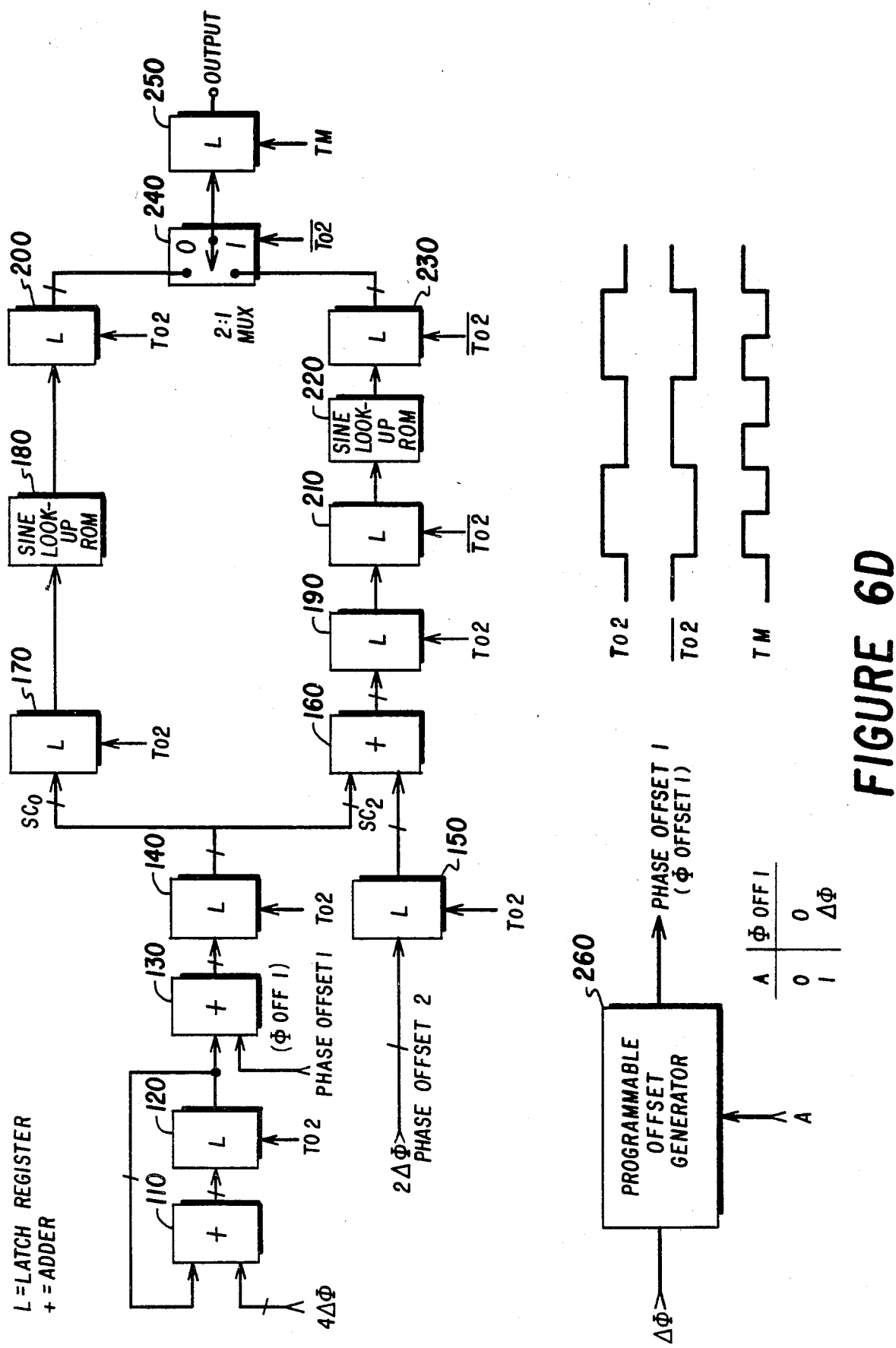
FIG. 6D shows an alternate embodiment of a sine generation block.

An embodiment of the sine generator block 45 in FIG. 5 is exemplified in FIG. 6D. An accumulator circuit comprising an adder 110 and a latch 120 provides a phase accumulated output. This output goes to a first phase offset circuit comprising an adder 130 and latches 140, 170, where the phase accumulated output signal is phase shifted in response to a first phase offset input. The shifted phase accumulated output is also additionally shifted by a second phase offset. This is accomplished by combining the first offset shifted output with a second phase offset signal at an adder 160. As a result, there are then two phase shifted signals: one shifted by a first phase offset and the other shifted by a first and a second phase offset. These offset shifted signals are converted to proper sine values by a sine lookup table 180, 220. The converted sine values are then selected at a predetermined order by a multiplexer 240 to produce a digital output. This digital output is further combined with others to form the waveform required of the numerical synthesizer.

Figure 4B:
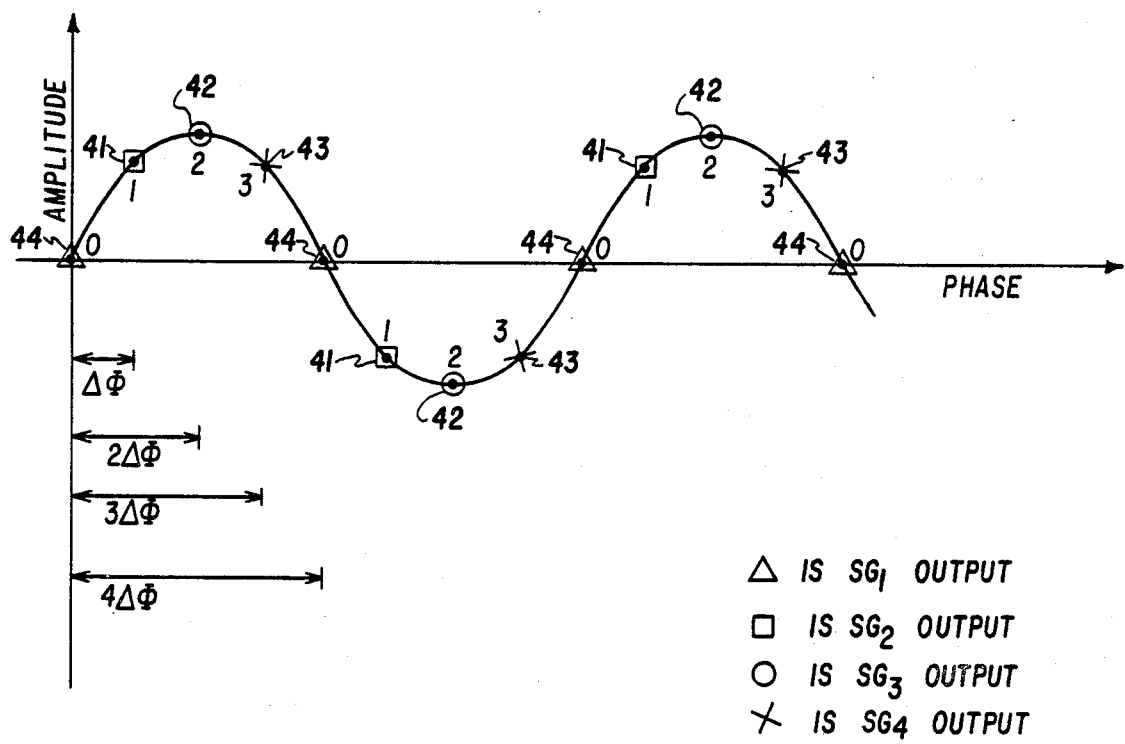
FIG. 4B illustrates an example of a synthesized signal resulting from the synthesizer of FIG. 4A.
Figure 7:
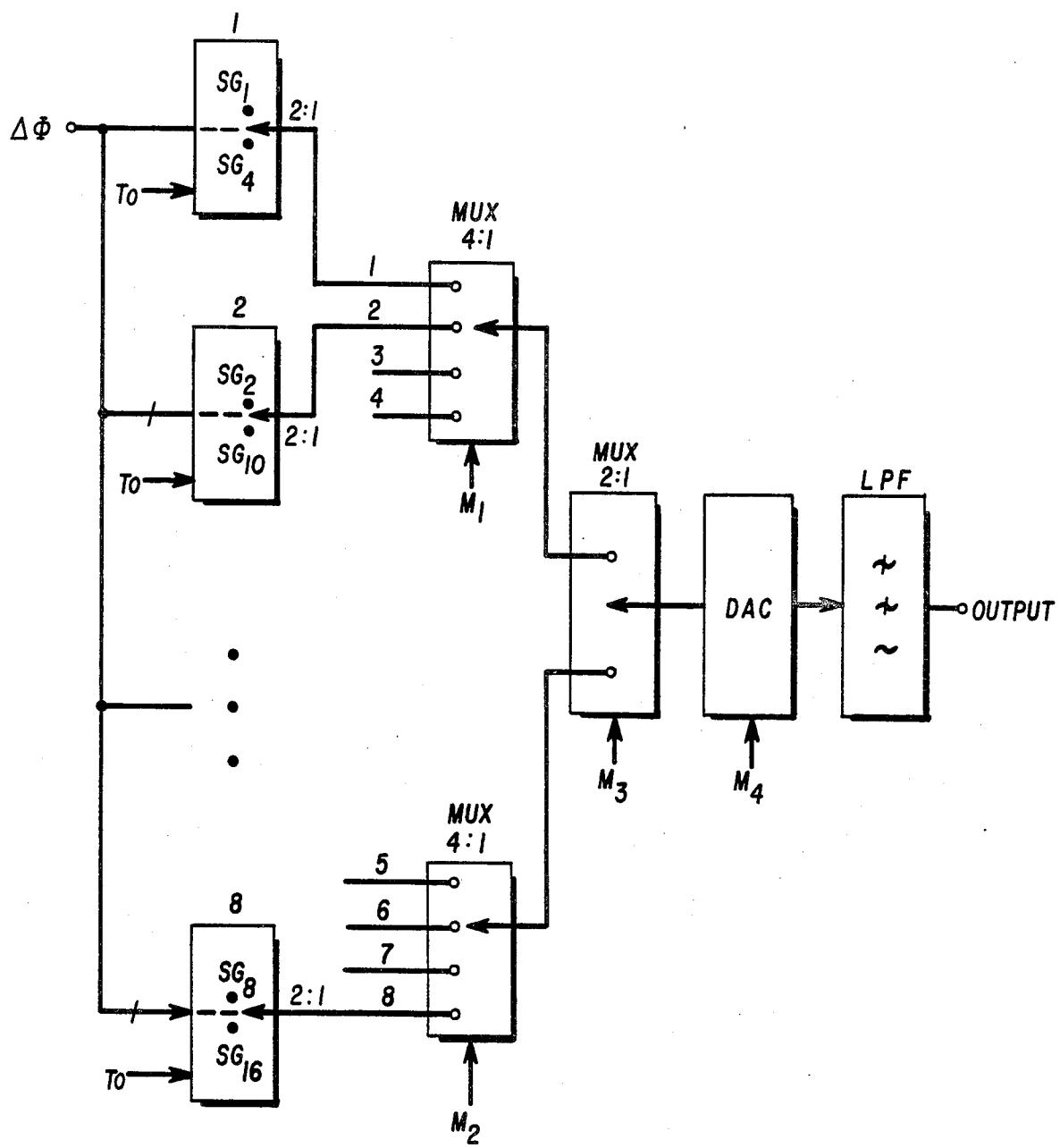
FIG. 7 is a block diagram of a 16-phase parallel synthesizer in accordance with the invention.
Figure 7:
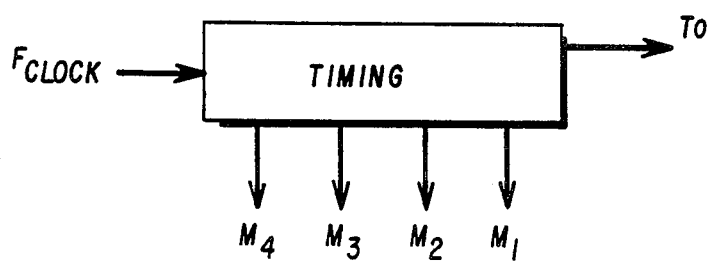

FIG. 7 shows a block diagram of a 16-channel system. Again a dual sine generator block is implemented. Eight dual channel units are needed. The 16-channel system has an advantage of increased synthesized output frequency over the four-channel system in FIG. 4. Stacking more channel units in parallel therefore increases the maximum output frequency proportionally.

We claim:

1. An apparatus for synthesizing a waveform comprising:
   first converter means for converting an applied phase increment signal into a plurality of parallel digital outputs representing points on a sine function, said plurality of digital outputs having phase offsets from one another determined in response to a plurality of phase offset signals generated from said applied phase increment signal; and
   a first multiplexer coupled to said first converter means for selectively coupling each of said plurality of parallel digital outputs in a selected order to provide an ordered digital output representative of a synthesized waveform.

2. The apparatus as in claim 1 further comprising:
   second converter means coupled to said first multiplexer for converting said ordered digital output into an analog output; and
   filter means coupled to said second converter means for filtering said analog output, thereby providing said synthesized waveform.

3. The apparatus as in claim 1 or 2 wherein said first converter means comprises a plurality of sine generators in parallel, each comprising:
   an adder having a first input port for receiving said applied phase increment signal, a second input port for receiving an additional input, and an output port for providing an adder output;
   a latching circuit for providing a latched output, said latching circuit having an input port coupled to said adder output port and an output port providing said latched output coupled to said adder second input port;
   phase offset means coupled to said latching circuit output port for providing a phase offset to said latched output in response to one of said plurality of phase offset signals; and
   memory means coupled to said phase offset means for providing one of said plurality of digital outputs.

4. The apparatus as in claim 1 or 2 wherein said first converter means comprises a plurality of sine generators in parallel, each comprising:
   accumulator means for generating a phase ramp in response to said applied phase increment signal;
   first phase offset means coupled to said accumulator means for providing a first phase offset to said phase ramp in response to a first phase offset signal;
   second phase offset means coupled to said first phase offset means for providing a second phase offset to said phase ramp in response to a second phase offset signal;
   first memory means coupled to said first phase offset means for providing a first digital output;
   second memory means coupled to said second phase offset means for providing a second digital output; and
   a second multiplexer coupled to said first and second memory means for selectively coupling each of said first and second digital outputs having first and second phase shifts, respectively, to provide one of said plurality of digital outputs.

5. The apparatus as in claim 1 or 2 wherein said first converter means comprises a plurality of sine generators in parallel, each comprising:
   accumulator means for generating a phase ramp in response to said applied phase increment signal;
   first phase offset means for generating at least one of said plurality of phase offset signals in response to said applied phase increment signal;
   first adder means coupled to said accumulator means and said first phase offset means for combining said phase ramp and said at least one of said plurality of phase offset signals to provide a first total phase signal;
   first memory means coupled to said first adder means for converting said first total phase signal into a digital output; and
   means for providing said digital output as one of said plurality of digital outputs.

6. The apparatus as in claim 5, wherein said first phase offset means comprises:
   divider means coupled to receive said applied phase increment signal for providing a plurality of intermediate phase offset signals; and
   circuit means for converting said plurality of intermediate phase offset signals into said at least one of said plurality of phase offset signals.

7. The apparatus as in claim 6 further comprising:

frequency modulation means coupled to input ports of said accumulator means and said first phase offset means for combining said applied phase increment signal with a frequency modulation input to provide a modulated applied phase increment signal.

8. The apparatus as in claim 6 futher comprising:

phase modulation means coupled to said first phase offset means for combining said at least one phase offset input with a phase modulation input to provide a modulated phase offset signal.

9. The apparatus as in claim 6 further comprising:

second phase offset means for providing a common phase offset signal in response to said applied phase increment signal;

second adder means for combining said common phase offset signal with said first total phase signal to produce a second total phase signal; and second memory means coupled to said second adder means for converting said second total phase signal into a digital output; and wherein said means for providing comprises a second multiplexer coupled to said first and second memory means for selectively coupling each of said plurality of digital outputs therefrom to provide one of said digital outputs having predetermined phase offsets.

10. The apparatus as in claim 5 further comprising:

frequency modulation means coupled to input ports of said accumulator means and said first phase offset means for combining said applied phase increment signal with a frequency modulation input to provide a modulated applied phase increment signal.

11. The apparatus as in claim 10 further comprising:

second phase offset means for providing a common phase offset signal in response to said applied phase increment signal;

second adder means for combining said common phase offset signal with said first total phase signal to produce a second total phase signal; and second memory means coupled to said second adder means for converting said second total phase signal into a digital output; and wherein said means for providing comprises a second multiplexer coupled to said first and second memory means for selectively coupling each of said digital outputs therefrom to provide one of said plurality of digital outputs having predetermined phase offsets.

12. The apparatus as in claim 5 further comprising:

phase modulation means coupled to said first phase offset means for combining said at least one of said plurality of phase offset signals with a phase modulation input to provide a modulated phase offset signal.

13. The apparatus as in claim 12 further comprising:

second phase offset means for providing a common phase offset signal in response to said applied phase increment signal;

second adder means for combining said common phase offset signal with said first total phase signal to produce a second total phase signal; and second memory means coupled to said second adder means for converting said second total phase signal into a digital output; and wherein said means for providing comprises a second multiplexer means coupled to said first and second memory means for selectively coupling each of said digital outputs therefrom to provide one of said plurality of digital outputs having predetermined phase offsets.

14. The apparatus as in claim 5 further comprising:

second phase offset means for providing a common phase offset signal in response to said applied phase increment signal;

second adder means for combining said common phase offset signal with said first total phase signal to produce a second total phase signal; and second memory means coupled to said second adder means for converting said second total phase signal into a digital output; and wherein said means for providing comprises a second multiplexer coupled to said first and second memory means for selectively coupling each of said digital outputs therefrom to provide one of said plurality of digital outputs having predetermined phase offsets.

15. A method of synthesizing a waveform comprising the steps of:

converting an applied phase increment signal into a phase ramp;

plurally phase shifting said phase ramp to provide a plurality of parallel ramps, each ramp being phase shifted by a predetermined amount;

converting each of said phase shifted ramps into a digital output representing points on a sine function;

selecting from each of said digital outputs in a selected order to provide an ordered digital output;

converting said ordered digital output into an analog output; and filtering said analog output, thereby providing said synthesized waveform.

16. The method as in claim 15 wherein said step of converting an applied phase increment signal comprises the step of accumulating said applied phase increment signal in steps at a predetermined rate to provide said phase ramp.

17. The method as in claim 15 or 16 wherein said step of selecting further comprises the step of preselecting a plurality of said digital outputs in a predetermined order to provide a plurality of pre-ordered digital outputs, said pre-ordered digital outputs being said digital outputs.

* * * * *

UNITED STATES PATENT AND TRADEMARK OFFICE
CERTIFICATE OF CORRECTION

PATENT NO.    :   4,454,486
DATED         :   June 12, 1984
INVENTOR(S)   :   Roland Hassun et al.

It is certified that error appears in the above-identified patent and that said Letters Patent is hereby corrected as shown below:

Column 3, line 41, after "be" insert -- , --;

Column 4, line 7, "BREIF" should read -- BRIEF --;

Column 4, line 47, delete "or" and insert -- is --;

Column 7, line 26, delete "input." and insert -- signal. --;

Signed and Sealed this

Seventh Day of May 1985

[SEAL]

Attest:

DONALD J. QUIGG

*Attesting Officer*     *Acting Commissioner of Patents and Trademarks*